United States Patent [19]

Takahashi et al.

[11] Patent Number: 4,523,121
[45] Date of Patent: Jun. 11, 1985

[54] MULTILAYER ELECTROSTRICTIVE ELEMENT WHICH WITHSTANDS REPEATED APPLICATION OF PULSES

[75] Inventors: Sadayuki Takahashi; Masatomo Yonezawa; Atsushi Ochi; Takeshi Yano; Takeshige Hamatsuki; Izumu Fukui, all of Tokyo, Japan

[73] Assignee: NEC Corporation, Tokyo, Japan

[21] Appl. No.: 493,583

[22] Filed: May 11, 1983

[30] Foreign Application Priority Data

| May 11, 1982 | [JP] | Japan | 57-79034 |
| May 11, 1982 | [JP] | Japan | 57-79035 |
| May 11, 1982 | [JP] | Japan | 57-79036 |
| May 11, 1982 | [JP] | Japan | 57-79037 |
| May 11, 1982 | [JP] | Japan | 57-79038 |
| May 11, 1982 | [JP] | Japan | 57-79039 |
| May 12, 1982 | [JP] | Japan | 57-78444 |
| May 12, 1982 | [JP] | Japan | 57-78445 |
| May 12, 1982 | [JP] | Japan | 57-78446 |
| May 12, 1982 | [JP] | Japan | 57-78447 |
| May 12, 1982 | [JP] | Japan | 57-78448 |
| May 12, 1982 | [JP] | Japan | 57-78449 |

[51] Int. Cl.³ .................................. H01L 41/18
[52] U.S. Cl. ........................... 310/334; 310/338
[58] Field of Search ............. 310/338, 339, 328, 332, 310/334, 335, 336, 365, 366, 364, 363, 337, 323, 325; 367/155, 156, 168; 357/38

[56] References Cited

U.S. PATENT DOCUMENTS

| 2,487,165 | 11/1949 | Miller | 310/363 |
| 2,894,317 | 7/1959 | Marks | 310/338 |
| 3,179,826 | 4/1965 | Trott et al. | 310/334 |
| 3,349,259 | 10/1967 | Kistler | 310/338 |
| 3,390,287 | 6/1968 | Sonderegger | 310/338 |
| 3,521,090 | 7/1970 | Angeloff | 310/366 |
| 3,586,889 | 6/1971 | Kolter | 310/363 |
| 3,593,068 | 7/1971 | Rosler | 357/36 |
| 3,686,518 | 8/1972 | Hartmann et al. | 310/313 B |
| 3,982,144 | 9/1976 | Rogers et al. | 310/337 |

Primary Examiner—Peter S. Wong
Assistant Examiner—D. L. Rebsch
Attorney, Agent, or Firm—Sughrue, Mion, Zinn, Macpeak, and Seas

[57] ABSTRACT

A multilayer electrostrictive element has electrostrictive sections (31) defined by internal electrodes (32) in a stack, with a peripheral surface which has a predetermined outline perpendicularly of an axis of the stack, each internal electrode with an outline which is approximately congruent with the predetermined outline (constant cross-section). In order that external electrodes (33, 34) may readily be connected to the internal electrodes grouped by twos, each internal electrode may have a peripheral end which is partly recessed from the predetermined outline, as in FIG. 8. Alternatively, the internal electrodes of each group may be connected together by a conductor rod which passes through the electrostrictive sections, preferably along their edges, contacting alternate electrodes. For a great number of internal electrodes, an element may be manufactured by laminating conductive-paste-printed green sheets transversely of the stack axis and then sintering the lamination. Each internal electrode may include a ceramic material, such as an electrostrictive material of the electrostrictive sections, another electrostrictive material of a lower sintering temperature, or glass.

4 Claims, 29 Drawing Figures

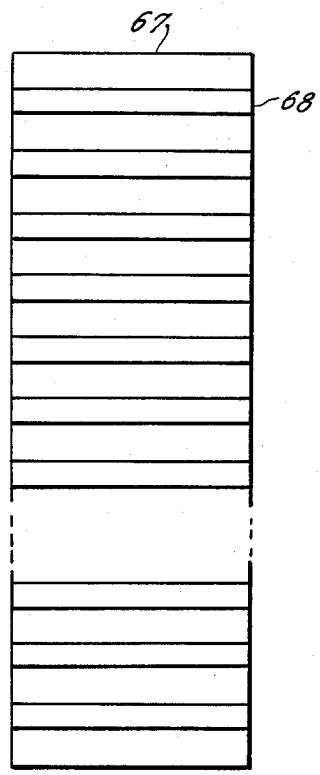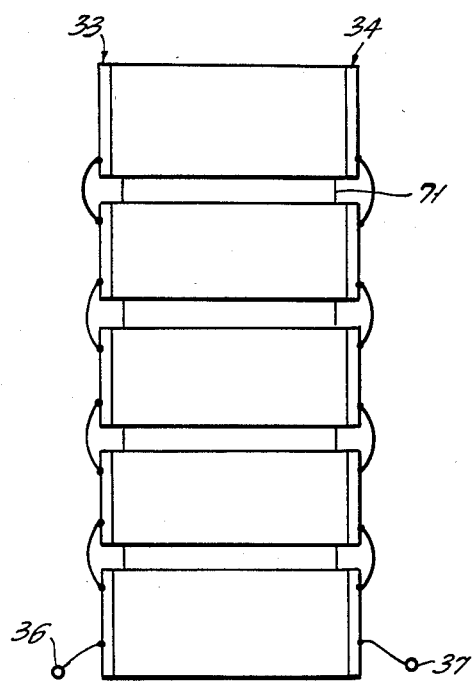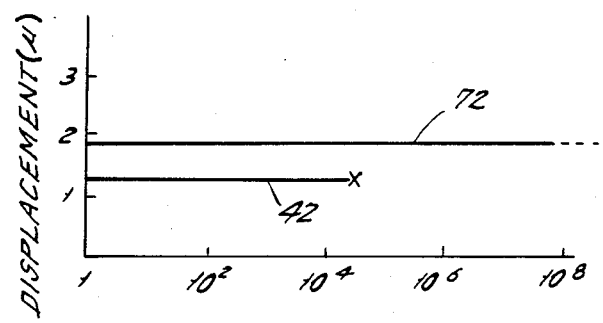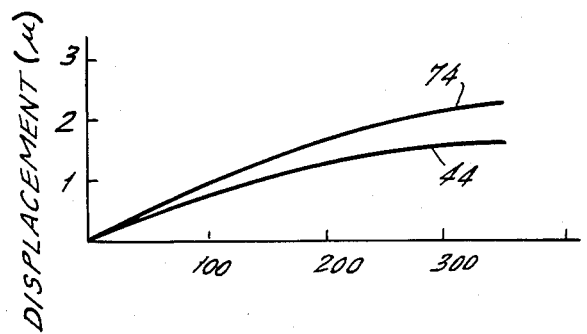

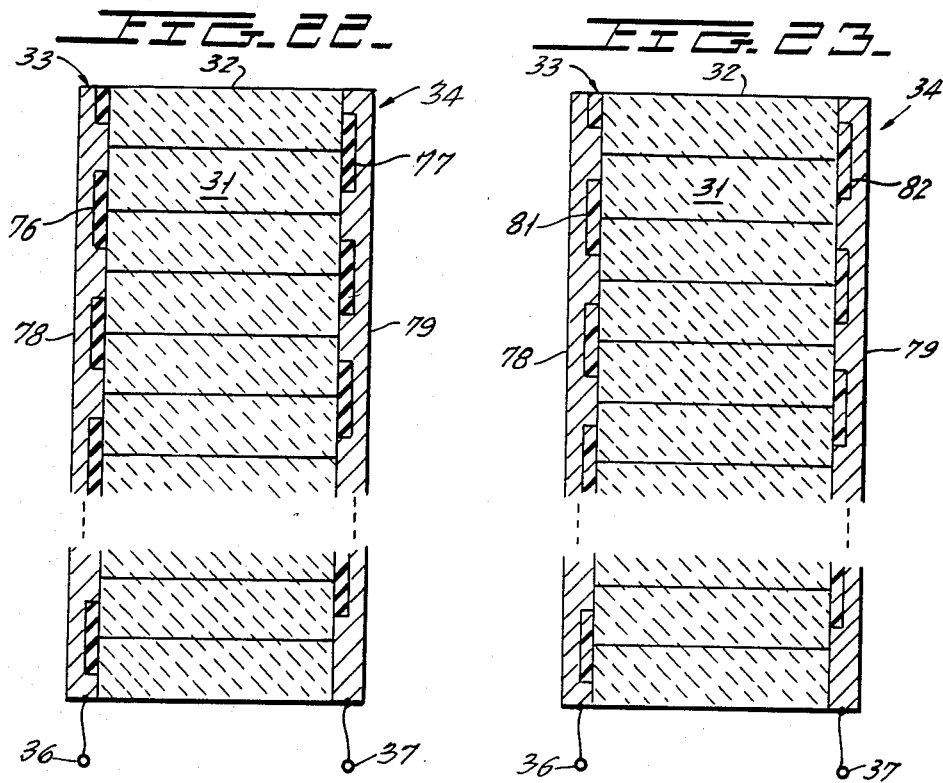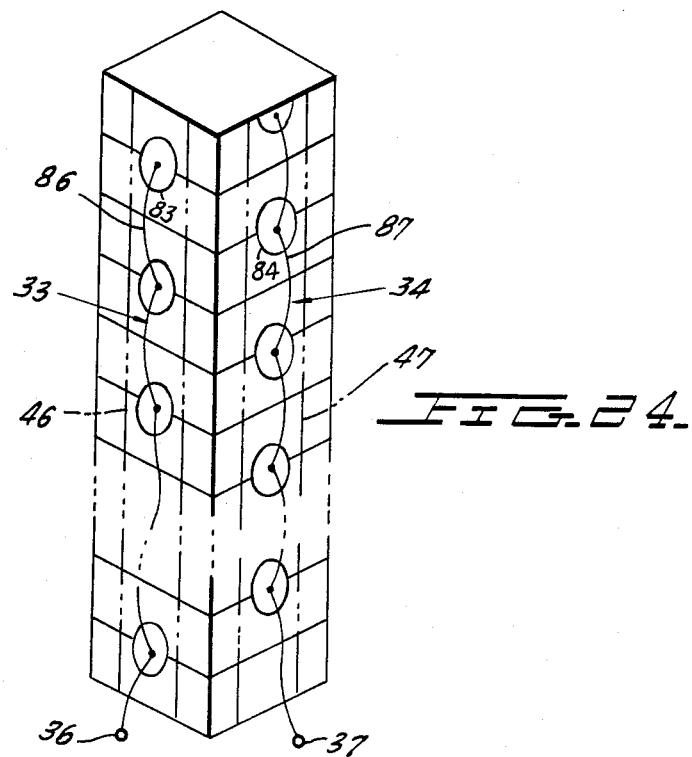

MULTILAYER ELECTROSTRICTIVE ELEMENT WHICH WITHSTANDS REPEATED APPLICATION OF PULSES

BACKGROUND OF THE INVENTION

This invention relates to an electrostrictive element or transducer of a multilayer structure which is generally called a stacked chip or ceramic capacitor structure in the art. An electrostrtictive element according to this invention is specifically useful in, among others, a printer head of an impact printer or a relay.

As described in a report contributed by Roderic Beresford to "Electronics," Nov. 3, 1981, pages 39 and 40, under the title of "Piezoelectric bender actuates tiny relays and dot-matrix printers," an electrostrictive element is useful as a printer head, a relay, or the like. An electrostrictive element is actuated by a d.c. voltage repeatedly supplied as voltage pulses when used in such fields of application. The element must withstand repeated application of such voltage pulses. In other words, the element must have a long life when a great number of voltage pulses are applied. Furthermore, it is desirable that the element give rise to a large displacement.

An electrostrictive element of a simplest type comprises an electrostrictive piece of a material capable of exhibiting a strong electrostrictive effect having a pair of electrodes on respective principal surfaces. When a d.c. voltage is supplied between the electrodes to produce an electic field, the electrostrictive material elongates and contracts in both the direction of the electric field and transversely. Such deformations or strains in the direction of the electric field and in the transverse direction are called the longitudinal and the transverse electrostrictive effects, respectively. It is known that the longitudinal electrostrictive effect ordinarily gives rise to two to three times as great a deformation as the transverse electrostrictive effect. The longitudinal electrostrictive effect therefore provides a higher efficiency of conversion from electric energy to mechanical energy. The deformation in the longitudinal or the transverse direction depends on the field intensity of the electric field produced in the electrostrictive piece.

When the transverse electrostrictive effect is used, it is possible with a certain applied voltage to achieve a displacement in the transverse direction which is proportional to the transverse dimension of the electrostrictive piece. When the longitudinal electrostrictive effect is used in order to take advantage of its higher efficiency of energy conversion, the displacement in the longitudinal direction does not grow for a given voltage with an increase in the dimension which the piece has in the longitudinal direction. This is because the field intensity becomes weak as the longitudinal dimension increases. It is therefore necessary, for attaining a great displacement with the longitudinal electrostrictive effect, to raise the applied voltage, so as to strengthen the field intensity. A power source for a high voltage is, however, bulky and expensive. Furthermore, a high voltage is objectionable in view of the danger inevitable during operation of the electrostrictive element and also in view of the withstanding voltage of IC's which are used in a driving circuit for the element. The element is therefore given the multilayer structure when the longitudinal electrostrictive effect is used.

As will later be described in detail with reference to two of nearly thirty figures of the accompanying drawings, a multilayer electrostrictive element comprises a plurality of electrostrictive sections defined in a stack or lamination by a plurality of internal electrodes which are perpendicular to an axis of the stack. The stack has a peripheral surface which has a predetermined outline perpendicularly to the axis. For use in a printer head or a relay, it is preferred that the predetermined outline be four sides of a rectangle. A first external electrode is connected to alternate ones of the internal electrodes and is placed externally of the peripheral surface. A second external electrode is connected to others of the internal electrodes and is positioned externally of the peripheral surface. At least one of the first and the second external electrodes may be extended in contact with the peripheral surface. Even in this event, it is possible to understand that the external electrode or electrodes are situated externally of the peripheral surface.

With a multilayer electrostrictive element, a great displacement is achieved at a low voltage even by the use of the longitudinal electrostrictive effect. It is to be noted here that each internal electrode has an internal electrode outline which is positioned only partly on the peripheral surface for connection to the first or the second external electrode. In other words, each internal electrode has an internal electrode area which is considerably narrower than a cross-sectional area of the stack. As will later be discussed with reference to several figures of the accompanying drawing, it has now been confirmed that this results in a short life which the electrostrictive element has when repeatedly supplied with voltage pulses. Moreover, this restricts the displacement, as compared with the displacement which is theoretically attainable.

SUMMARY OF THE INVENTION

It is therefore an object of the present invention to provide a multilayer electrostrictive element which has a long life, even when voltage pulses are repeatedly applied to drive the element.

It is another object of this invention to provide an electrostrictive element of the type described, which provides a greater displacement as compared with that achieved by conventional electrostrictive elements.

Other objects of this invention will become clear as the description proceeds.

An electrostrictive element to which this invention is applicable comprises a plurality of electrostrictive sections of an electrostrictive material defined in a stack by a plurality of internal electrodes which are perpendicular to an axis of the stack, first means for electrically connecting alternate ones of the internal electrodes together, and second means for electrically connecting others of the internal electrodes togther. The stack has a peripheral surface which has a predetermined outline perpendicularly of the axis. According to this invention, each internal electrode is given a peripheral end of an internal electrode outline which is approximately congruent with the predetermined outline.

According to an aspect of this invention, each internal electrode has an internal electrode area which is equal to a cross-sectional area of the stack with the peripheral ends of the respective internal electrodes positioned on the peripheral surface, which has the predetermined outline throughout the stack.

According to another aspect of this invention, each internal electrode has an internal electrode area perpendicularly of the axis, which area is narrower than a cross-sectional area of the stack, in an electrostrictive element wherein the peripheral surface has the predetermined outline throughout the stack.

BRIEF DESCRIPTION OF THE DRAWING

FIG. 18 as a schematic top view of a green sheet piece for use in manufacturing the element of the type depicted in FIGS. 16 and 17;

FIG. 19 is a schematic side view of an electrostrictive element according to a sixth embodiment of this invention;

FIG. 20 shows the life for conventional electrostrictive elements and for electrostrictive elements of the type depicted in FIG. 19;

FIG. 21 shows the displacement achieved by the elements mentioned in conjunction with FIG. 20;

FIG. 22 is a schematical longitudinal sectional view of an electrostrictive element according to a seventh embodiment of this invention;

FIG. 23 is a schematical longitudinal sectional view of an electrostrictive element according to an eighth embodiment of this invention;

FIG. 24 is a schematic perspective view of an electrostrictive element according to a ninth embodiment of this invention;

DESCRIPTION OF THE PREFERRED EMBODIMENTS

Figure 1:
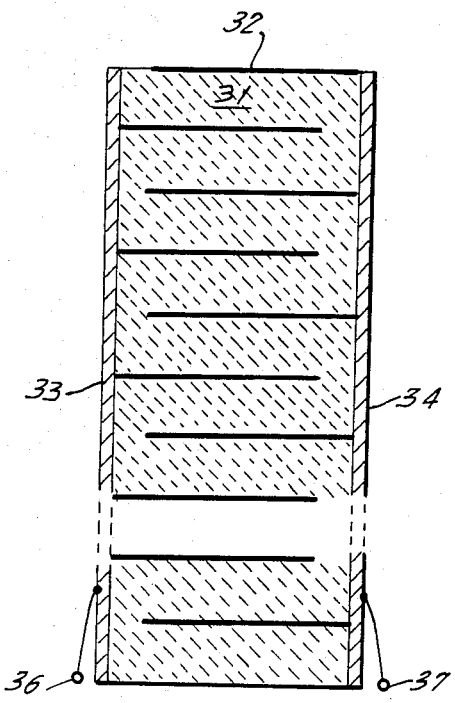
FIG. 1 is a schematic longitudinal sectional view of a conventional electrostrictive element.
Figure 2:
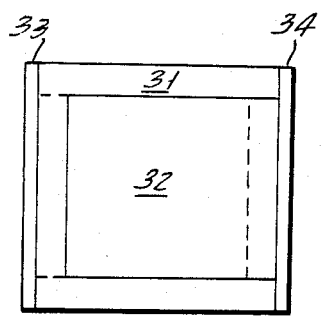
FIG. 2 is a top view of the electronstrictive element illustrated in FIG. 1.

Referring to FIGS. 1 and 2, a conventional multilayer electrostrictive element or transducer will be described at first in order to facilitate an understanding of the present invention, although the claims are directed primarily to FIG. 22. The element comprises a stack or lamination of a plurality of electrostrictive sections or segments 31 of an electrostrictive material capable of exhibiting a strong electrostrictive effect. The electrostrictive sections 31 are defined in the stack by a plurality of internal electrodes 32 which are indicated by thick lines and are disposed perpendicular to an axis of the stack with a predetermined spacing. Although called "internal electrodes," the electrodes 32 may be placed on one or both of the top and the bottom surfaces of the stack. The stack has a peripheral surface whose cross section defines a predetermined outline. In the example being illustrated, the predetermined outline consists of four sides of a rectangle. The peripheral surface has the predetermined outline throughout the stack (i.e. the stack has a constant cross-section). It is possible to render the predetermined spacing (between electrodes 32) as small as several microns.

As seen from FIGS. 1 and 2, each internal electrode 32 has an end lying on the peripheral surface of the stack. More particularly, alternate ones of the internal electrodes 32 have their respective ends on one of four side surfaces of the stack. Others of the internal electrodes 32 have the ends on an opposing side surface of the stack as outlined by dashed lines in FIG. 2. A first external electrode 33 is formed on the first-mentioned side surface, in contact with the ends of the alternate ones of the internal electrodes 32. A second external electrode 34 is formed on the opposing side surface, in contact with the ends of the others of the internal electrodes 32. First and second electrode terminals 36 and 37 are connected to the first and the second external electrodes 33 and 34, respectively.

When a d.c. voltage is supplied between the electrode terminals 36 and 37, electric fields are produced in the respective electrostrictive sections 31. The electrostrictive element elongates axially of the stack. When a d.c. voltage pulse is repeatedly applied to the element a great number of times, the element is mechanically damaged, particularly if the voltage is raised to achieve a great displacement. Furthermore, the elongation or displacement of the element is appreciably small as compared with the elongation which should theoretically be attained.

As will later be evidenced by various examples in comparison with references, it has now been confirmed that such defects of a conventional electrostrictive element result from the fact that an area on which the internal electrodes 32 are superposed is considerably narrower than a cross-sectional area of the stack. More specifically, the electric field is produced in each electrostrictive section 31 substantially only at a central portion between the opposing internal electrodes 32. The electric field is weak at a peripheral portion surrounding the central portion. The elongation therefore takes place at such central portions of the respective electrostrictive sections 31 and hardly occurs at the peripheral portions. The elongation of the element as a whole is consequently adversely affected by the peripheral portions. Moreover, concentration of the stress takes place along the boundary between the central and the peripheral portions. This results in cracks or other mechanical damage when a large number of voltage pulses are applied to the element.

Figure 3:
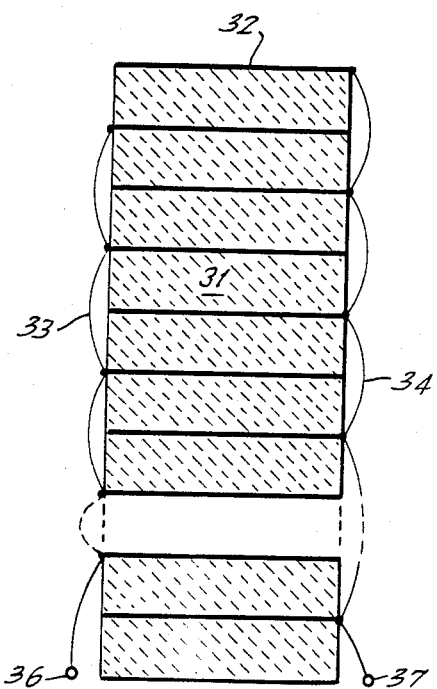
FIG. 3 is a schematical longitudinal sectional view of an electrostrictive element according to a first embodiment of the instant invention.
Figure 4:
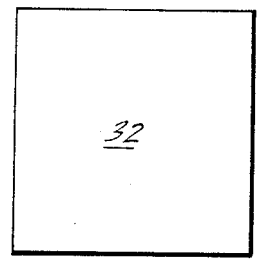
FIG. 4 is a top view of the electrostrictive element depicted in FIG. 3.

Referring now to FIGS. 3 and 4, an electrostrictive element according to a first embodiment of this invention comprises similar parts as those in FIGS. 1 and 2, such parts being designated by like reference numerals. The peripheral end of each internal electrode 32, however, has an outline which is congruent with the outline which the peripheral surface of the stack has perpendicularly of the stack axis. The peripheral ends of the respective internal electrodes 32 are positioned on the peripheral surface of the stack. Furthermore, each internal electrode 32 has an internal electrode area which is equal to the cross-sectional area of the stack. A first external electrode 33 is positioned externally of the peripheral surface of the stack and is brought into contact with the peripheral ends of alternate ones of the internal electrodes 32. A second external electrode 34 is laid outwardly of the peripheral surface of the stack and connected to the peripheral ends of the remaining internal electrodes 32.

As Example I, electrostrictive elements of the structure illustrated with reference to FIGS. 3 and 4, were manufactured as follows. At first, a slurry was prepared by suspending a mixture of presintered powder of a solid solution of lead magnesium niobate Pb(Mg$_{1/3}$Nb$_{2/2}$)O$_3$ and lead titanete PbTiO$_3$ in a mol ratio of 9 to 1 and an organic binder, in an organic solvent in the manner known in the art. The presintering was carried out at 800° C. for two hours. It is known that a sintered piece of the solid solution exhibits a strong electrostrictive effect. The slurry was applied onto a polyester film known as a Mylar film by the doctor blade method to a thickness of several hundreds of microns and then dried. The green sheet thus formed, was peeled off the polyester film and subsequently cut into green sheet pieces of a predetermined size. Platinum paste was printed to form a platinum paste layer on a surface of each green sheet piece. The green sheet pieces with the printed platinum paste layers, were stacked, rendered integral in a hot press, machined to predetermined dimensions to expose the peripheral ends of the respective platinum paste layers on the peripheral surface of each integral stack, and subsequently sintered at about 1200° C. for one hour. The green sheet pieces became the electrostrictive sections 31 (FIG. 3). Fired layers of the platinum paste became the internal electrodes 32.

Having been machined to the predetermined dimensions, each integral stack had a square cross section of 3 mm by 3 mm and a height of 10 mm. The spacing between two adjacent ones of the internal electrodes 32 was 250 microns. Lead wires were soldered to the peripheral ends of the respective internal electrodes 32 so as to serve as the first and the second external electrodes 33 and 34 and so that a pair of ends of the respective lead wires serve as the first and the second electrode terminals 36 and 37.

As Reference I, electrostrictive elements of the conventional structure illustrated with reference to FIGS. 1 and 2, were likewise manufactured. An area on which the internal electrodes 32 were superposed, was 84% of the cross-sectional area of the stack. The external electrodes 33 and 34 were formed by applying silver paste onto the side surfaces and then firing the paste.

Figure 5:
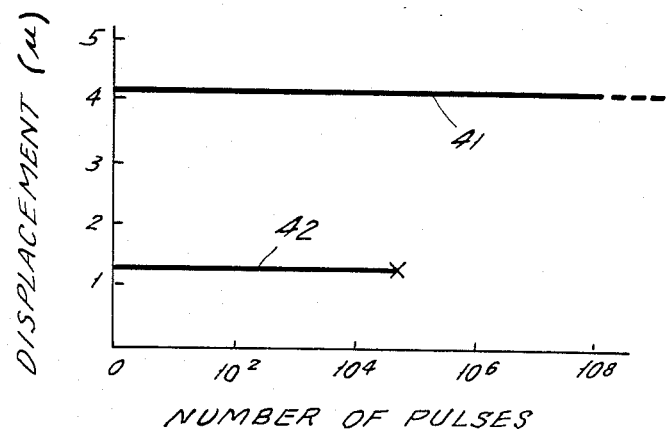
FIG. 5 shows the life for conventional electrostrictive elements and for electrostrictive elements of the type shown in FIGS. 3 and 4.

Turning now to FIG. 5, a pulse sequence was continuously applied to each of the electrostrictive elements of Example I and of Reference I. Each pulse was a half of a sinusoidal wave of an amplitude of 250 volts. Each pulse had a pulse width of 1 millisecond. As shown by an upper line 41, the elements of Example I showed a maximum displacement of 4.1 microns. A lower curve 42 represents that the elements of Reference I showed a maximum displacement of only 1.3 microns. Each element of Example I was not damaged or broken even when the pulses were applied one hundred million times or repetitions as shown by the upper line 41. Each element of Reference I was damaged as indicated by a cross when the pulses were applied about twenty-five thousand times.

Figure 6:
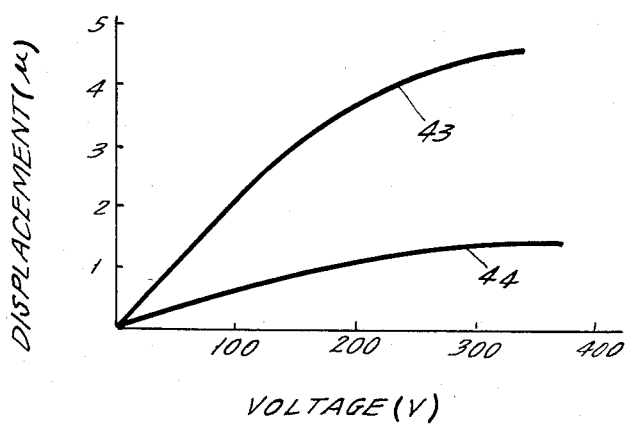
FIG. 6 shows the displacement attained by the electrostrictive elements mentioned in connection with FIG. 5.

Turning further to FIG. 6, a d.c. voltage was applied to each of the electrostrictive elements of Example I and of Reference I. Displacements were measured with the voltage varied. As is clear from upper and lower curves 43 and 44 for the elements of Example I and of Reference I, respectively, the elements of Example I showed two to three times as great a displacement as the elements of Reference I at a given voltage (and consequently at a given field intensity).

Figure 7:
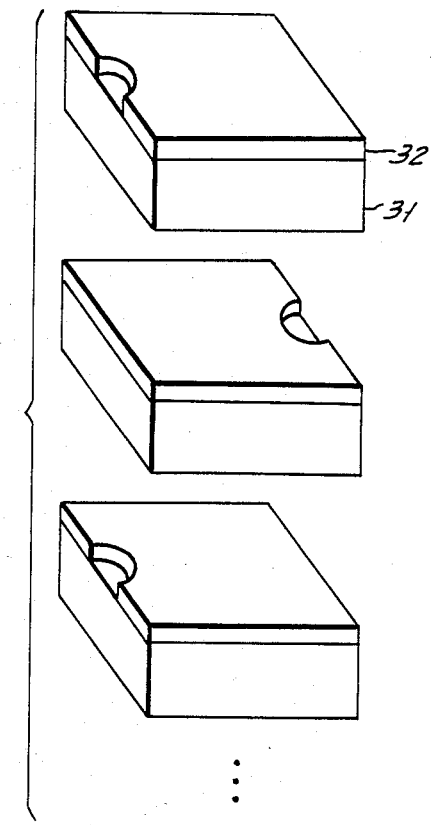
FIG. 7 schematically and partially shows a perspectively exploded view of an electrostrictive element according to a second embodiment of this invention.
Figure 8:
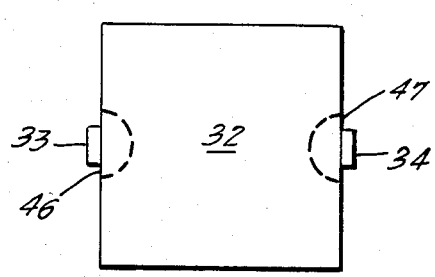
FIG. 8 is a top view of the electrostrictive element illustrated in FIG. 7.

Referring to FIGS. 7 and 8, an electrostrictive element according to a second embodiment of this invention comprises similar parts designated by like reference numerals. Somewhat different from the internal electrodes 32 described in conjunction with FIGS. 3 and 4, each internal electrode 32 has a peripheral end of an internal electrode outline which is approximately congruent with the predetermined outline of the stack. Each internal electrode 32 has an internal electrode area which is a little narrower than the cross-sectional area of the stack. At any rate, the internal electrode outlines of the respective internal electrodes 32 are congruent with one another. More particularly, the peripheral end of each internal electrode 32 comprises a first and a second peripheral part. The first peripheral part is congruent with the predetermined outline except for the second peripheral part. The first peripheral parts of the respective internal electrodes 32 are situated on the peripheral surface of the cross-section of the stack. The second peripheral parts of alternate ones of the internal electrodes 32 are positioned in the stack so as to define a first area 46 on the peripheral surface. The second peripheral parts of others of the internal electrodes 32 likewise define a second area 47 on the peripheral surface. In the example being illustrated, the predetermined outline again consists of four sides of a rectangle. The second peripheral part of each internal electrode 32 is arcuately recessed from one of the four sides. Furthermore, the first and the second areas 46 and 47 are defined on opposing side surfaces of the stack. In any event, the first and the second external electrodes 33 and 34 are formed on the first and the second areas 46 and 47, respectively, like in the element illustrated with reference to FIGS. 1 and 2.

As Example II, electrostrictive elements were manufactured as described in conjunction with the elements of Example I except that each internal electrode 32 (FIG. 7) had an internal electrode area which was 92% of the cross-sectional area of the stack. Silver paste was applied in stripes onto the first and the second areas 46 and 47 and then fired into the first and the second external electrodes 33 and 34. The electrode terminals 36 and 37 were attached to the respective external electrodes 33 and 34.

The life tests and tests for the displacement were carried out for the electrostrictive elements of Example II and of Reference I as described in connection with FIGS. 5 and 6. The results were similar except that the maximum displacement was 4.0 microns and a little smaller than that attained by the elements of Example I.

Referring again to FIGS. 7 and 8, it is possible to form the first and the second areas 46 and 47 on two adjacent side surfaces of the stack. Alternatively, the second or arcuately recessed peripheral part may be offset along an outline which is congruent with the predetermined outline so that both the first and the second areas 46 and 47 may be formed on one of the four side surfaces of the stack. In any event, the predetermined outline may be circular, elliptic, or the like.

Figure 9:
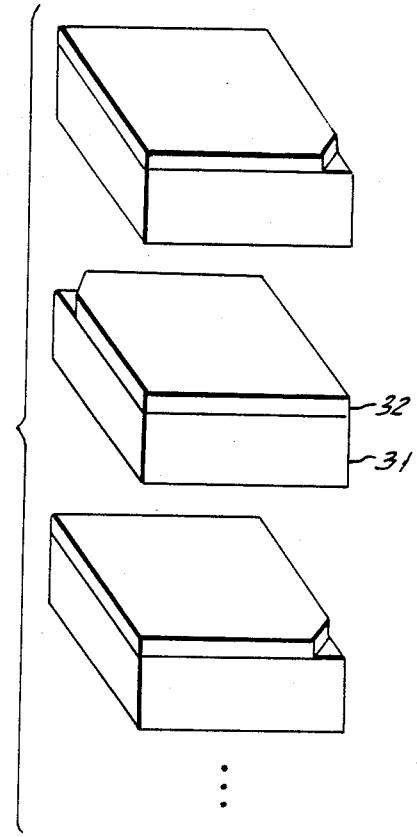
FIG. 9 schematically and partially shows a perspectively exploded view of an electrostrictive element according to a modification of the element depicted to FIGS. 7 and 8.

Turning to FIG. 9, the second peripheral part may be a short linear portion which intersects two adjacent sides of the predetermined outline of a rectangular shape. In the example being illustrated, the first area is formed on two adjacent side surfaces of the stack along an edge. The second area is similarly formed on two other side surfaces. As described in connection with FIGS. 7 and 8, the first and the second areas may be formed so as to share one of the four side surfaces in common. In this event, it is possible to form the first and the second external electrodes on that one of the side surfaces.

Figure 10:
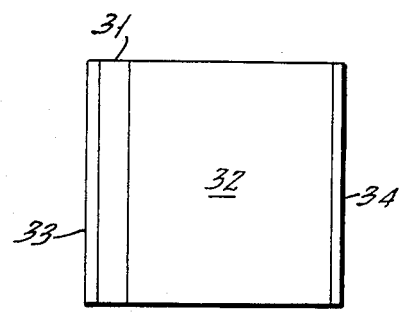
FIG. 10 is a top view of an electrostrictive element according to another modification of the element illustrated in FIGS. 7 and 8.

Turning further to FIG. 10, the second peripheral part may be a line which intersects opposing sides of the predetermined outline of a rectangle. It may appear that the electrostrictive element depicted in FIG. 10 is similar to the conventional element. The fact is quite different in that the first peripheral part of each internal electrode 32 is placed on a majority of the peripheral surface and in that the life is quite unexpectedly lengthened with the attainable displacement rendered astonishingly great.

Figure 11:
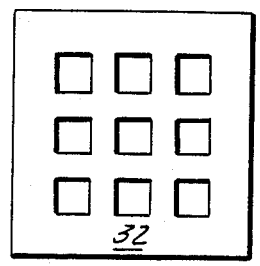
FIG. 11 is a schematic top view of an electrostrictive element according to a third embodiment of this invention.

Referring to FIG. 11, an electrostrictive element according to a third embodiment of this invention is similar in structure to that illustrated with reference to FIGS. 3 and 4 and that illustrated with reference to FIGS. 7 and 8 or FIG. 9 or 10 in that each internal electrode 32 has an internal electrode outline congruent with the predetermined outline of the stack and in that each internal electrode 32 has an internal electrode area which is smaller than the cross-sectional area of the stack. The internal electrode area is rendered small by forming at least one hole through each internal electrode 32. In the illustrated example, nine holes are formed in a matrix configuration in each internal electrode 32 of a square shape.

As Examples III, IV, and V, electrostrictive elements were manufactured as described in conjunction with the elements of Example I and with the internal electrode areas rendered 95%, 85%, and 70% of the cross-sectional area, respectively. The holes were readily formed by screen printing the platinum paste onto the surface of each green sheet piece. The first and the second external electrodes 33 and 34 (FIGS. 3 and 4) were formed by soldering a pair of lead wires to the peripheral ends of the respective internal electrodes 32 as described before.

Figure 12:
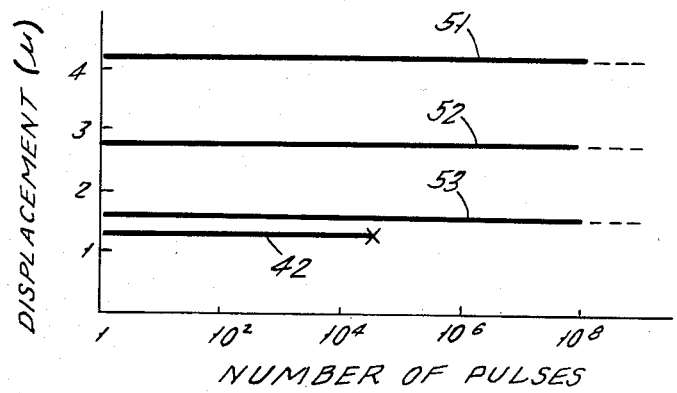
FIG. 12 shows the life for conventional electrostrictive elements and for electrostrictive elements of the structure depicted in FIG. 11.

Turning to FIG. 12, tests for the life and the maximum displacement were carried out for the electrostrictive elements of Examples III through V and of Reference I as described in connection with FIG. 5. The life and the maximum displacement are shown by lines 51, 52, and 53 for the elements of Examples III through V, respectivly, and by the line 42 for the elements of Reference I as above. Irrespective of the fact that each internal electrode area was smaller in the elements of Example V than the elements of Reference I, the line 53 shows an astonishingly long life with an appreciably greater maximum displacement.

Figure 13:
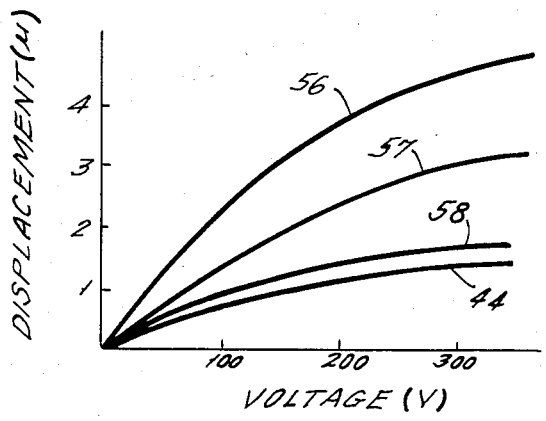
FIG. 13 shows the displacement achieved by the elements mentioned in conjunction with FIG. 12.

Turning further to FIG. 13, displacements were measured as described in connection with FIG. 6. Curves 56, 57, and 58 show the results for the elements of Examples III through V, respectively. Despite the fact that each internal electrode area of the elements of Example IV was not much greater than that in the elements of Reference I, the curve 57 shows a considerably greater displacement than that depicted by the curve 44 for the elements of Reference I as in FIG. 6.

Figure 14:
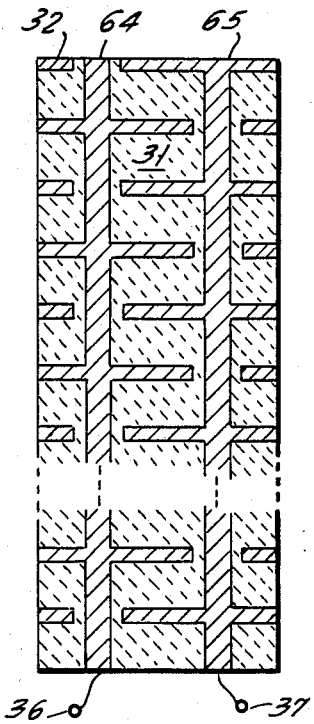
FIG. 14 is a schematic longitudinal sectional view of an electrostrictive element according to a fourth embodiment of this invention.
Figure 15:
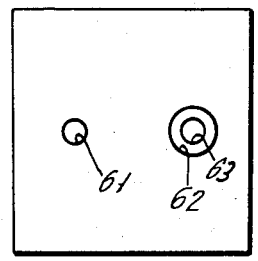
FIG. 15 is a schematic top view of a green sheet piece for use in manufacturing the element shown in FIG. 14.

Referring to FIGS. 14 and 15, an electrostrictive element according to a fourth embodiment of this invention is similar to that described with reference to FIG. 11 in that each internal electrode 32 has a smaller hole 61 of a predetermined inside diameter and a greater hole 62 of a greater inside diameter as exemplified in FIG. 15. Each internal electrode outline is preferably congruent with the predetermined outline which the peripheral surface of the stack has perpendicularly of the stack axis. In the example being illustrated, the internal electrode outline consists of four sides of a square. Furthermore, the smaller and the greater holes 61 and 62 are positioned symmetrically on a line bisecting opposing sides of the square on both sides of another line bisecting other opposing sides. Each electrostrictive section 31 on which the internal electrode 32 is formed, has two holes in registration with the smaller and the greater holes 61 and 62. One of the holes formed through the electrostrictive section 31 has the predetermined inside diameter and indicated at 63. The outer hole of the electrostrictive section 31 also has the predetermined inside diameter.

As best shown in FIG. 14, electrostrictive sections 31 with such internal electrodes 32 are stacked so that the smaller and the greater holes of alternate ones of the internal electrodes 32 may be aligned with the greater and the smaller holes of others of the internal electrodes 32, respectively. A first conductor rod 64, which serves for the first external electrode 33 (FIG. 1 or 3), fills the smaller holes of the alternate ones of the internal electrodes 32 in contact with such internal electrodes 32 and passes through the greater holes of the other internal electrodes and those of the holes of the electrostrictive elements 31 which are aligned with the smaller holes of the alternate ones of the internal electrodes 32 and consequently with the greater holes of the other internal electrodes. Similarly, a second conductor rod 65 fills the smaller holes of the other internal electrodes in contact therewith and passes through the greater holes of the alternate ones of the internal electrodes 32 and the other holes of the electrostrictive sections 31 to serve for the second external electrode 34. In contrast to the external electrodes 33 and 34 of each electrostrictive element illustrated with reference to FIGS. 3 and 4, it is readily possible to stably connect the conductors 64 and 65 to the alternate ones of the internal electrodes 32 and to the other internal electrodes, respectively.

As Example VI, electrostrictive elements were manufactured with the structure described in conjunction with FIGS. 14 and 15. A pair of holes of a common inside diameter was drilled through each green sheet piece formed as described in connection with Example I. As depicted in FIG. 15, platinum paste was screen printed on the drilled green sheet piece to leave a blank area of a greater diameter around the hole 63 of the green sheet piece and was filled in the holes, such as 63, of each green sheet piece. As described in connection with Example I, the green sheet pieces with the printed and filling platinum paste were stacked, rendered integral, and then sintered. During the sintering process, the platinum paste filling the respective holes of the stacked green sheet pieces was fired into platinum rods to serve as the conductor rods 64 and 65. When the spacing between two adjacent internal electrodes 32 was 0.1 mm, it was confirmed that the predetermined inside diameter of 0.15 mm and the greater inside diameter of 0.6 mm were sufficient to readily and stably provide the conductors 64 and 65 without any short circuit between the successive internal electrodes 32. Incidentally, the elements had a square cross section of 10 mm by 10 mm.

Turning again to FIG. 15, it is not necessary that the smaller and the larger holes 61 and 62 be circular in shape. Regardless of the shape or shapes of the holes 61 and 62, the smaller hole 61 should have a smaller inside measure, which may be called a predetermined inside measure. The larger holes 62 should have a greater inside measure preferably in common. It is also unnecessary that the holes 61 and 62 be symmetrically situated on both sides of the center of the internal electrode 32. It is only necessary on manufacturing the stack of electrostrictive sections 31 that the smaller holes 61 of alternate ones of the internal electrodes 32 be aligned with the greater holes 62 of others of the internal electrodes 32 with the greater holes 62 of the alternate ones of the internal electrodes 32 aligned with the smaller holes 61 of the other internal electrodes. For example, it is possible to form the "holes" in each green sheet piece of a rectangular cross section by forming deeply arcuately recessed indents from one of the four sides of the rectangle.

Figure 16:
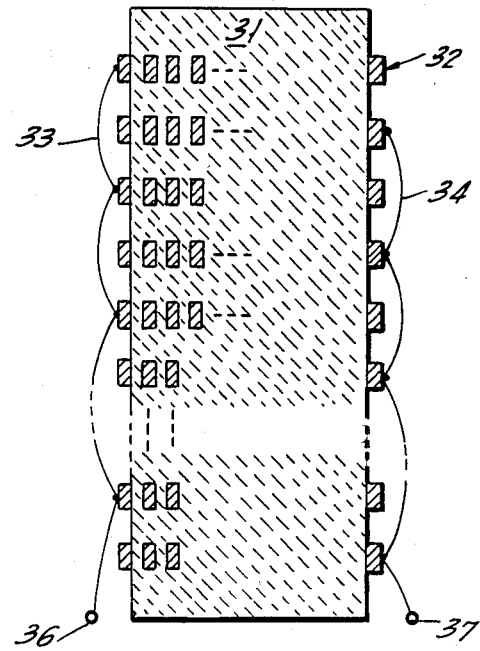
FIG. 16 is a schematical longitudinal sectional view of an electrostrictive element according to a fifth embodiment of this invention.
Figure 17:
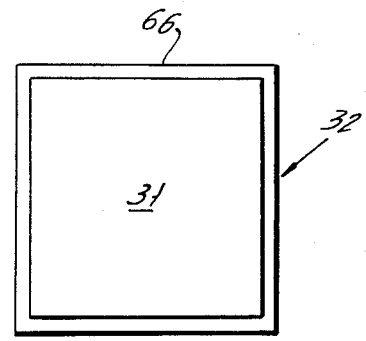
FIG. 17 is a top view of the element illustrated in FIG. 16.

FIGS. 16 and 17 are an electrostrictive element according to a fifth embodiment of this invention. It is possible to understand that the element being illustrated is similar to that described in connection with FIG. 11. More particularly, each internal electrode 32 has an internal electrode outline congruent with the predetermined outline which the peripheral surface of the stack as viewed along a plane perpendicular to the stack axis. A peripheral end of each internal electrode 32 is situated on the peripheral surface of the stack. An internal electrode area which the internal electrode 32 has orthogonally of the stack axis, is smaller than the cross-sectional area of the stack. The area is rendered narrow by a plurality of parallel holes formed through each internal electrode 32 with a common height parallel to the stack axis. For the reason which will presently become clear, the holes in the respective internal electrodes 32 are preferably aligned parallel to the stack axis. The electrostrictive sections 31 are continuous throughout the stack through the aligned holes.

More particularly referring to FIGS. 16 and 17, each internal electrode 32 comprises a plurality of internal electrode sections, each having a predetermined width parallel to the stack axis and a section end. The internal electrode sections of each internal electrode 32 are arranged at a predetermined distance. The internal electrode 32 preferably comprises a conductor piece 66 on the peripheral surface of the stack in contact with the section ends of the respective internal electrode sections. The conductor piece or pieces 66 provide a part of the peripheral end. The first external electrode 33 is formed by soldering or otherwise attaching a lead wire either to the conductor piece 66 of alternate ones of the internal electrodes 32 or to those of the internal electrode sections of the alternate ones of the internal electrodes 32 which are placed on the peripheral surface of the stack. The second external electrode 34 is similarly formed by connecting another lead wire to the peripheral ends of others of the internal electrodes 32. It is possible to form a pair of such conductor pieces in contact with both ends of each internal electrode section for each internal electrode 32.

FIG. 18 shows a green sheet piece 67 used in manufacturing an electrostrictive element of the structure illustrated in FIGS. 16 and 17. Platinum paste is printed in stripes on the green sheet piece as exemplified at 68. The element is manufactured by stacking a predetermined number, such as thirty sheets, of the green sheet pieces 67 with the platinum paste stripes 68, rendering the lamination integral in a hot press, and subsequently sintering the integral lamination. The platinum paste stripes 68 provide the internal electrode sections of the respective internal electrodes 32. The green sheet portions between layers of the internal electrode sections provide the electrostrictive sections 31 which are continuous as described above. The green sheet pieces 67 with the printed stripes 68 enable the element to be readily manufactured with a smaller number of green sheet pieces, as compared with the elements described in connection with Examples I through VI as will shortly become clear.

As Example VII, green sheet pieces were manufactured as in Example I. Each green sheet piece was about 3 mm wide, 10 mm long, and 100 microns thick. Platinum paste was screen printed on each green sheet piece. Each platinum paste stripe 68 (FIG. 18) had a width selected between 20 and 30 microns. Each blank area left between two adjacent platinum paste stripes 68 had a width which was selected between 20 and 30 microns. Thirty green sheet pieces with the printed stripes, were stacked for each electrostrictive element with the platinum paste stripes printed on both surfaces of the green sheet piece which was to be placed at an end of the lamination. It is to be noted in this connection that a stack and an axis of stack often referred to herein, should refer to a stack of the electrostrictive sections 31 (FIGS. 1, 3, and the like) rather than to a stack or lamination of the green sheet pieces 67 under consideration. The stacked green sheet pieces 67 were processed as described in connection with Example I. Silver paste was printed on the peripheral surface of each element and was fired into the conductor pieces 66 (FIG. 17). It was readily possible to manufacture an electrostrictive element in which a great number of electrostrictive sections 31 were defined between the internal electrodes 32.

FIG. 19 is an electrostrictive element according to a sixth embodiment of this invention. The internal structure may be similar to that described in connection with the conventional electrostrictive element with reference to FIGS. 1 and 2. It is, however, to be noted that those parts of the electrostrictive sections 31 (FIG. 1) are removed at selected heights of the stack which do not contribute to the electrostrictive effect. By way of example, indents or grooves 71 are formed on the peripheral surface. Each indent 71 may be formed along the whole periphery of the peripheral surface by a diamond cutter.

When attention is directed to a first peripheral part defined by the bottom of each indent 71, it is understood that the internal electrode outline of each internal electrode 32 (FIG. 1) is approximately congruent with an outline which the first peripheral part has perpendicular to the stack axis and which may again be called the predetermined outline. The peripheral surface further comprises second peripheral parts from which each indent 71 is recessed to define the first peripheral part. Each internal electrode 32 has an end on the second peripheral part, as will be understood from FIGS. 1 and 2. In order that even a part of the internal electrodes 32 may not be removed, it is preferred that each indent 71 be formed only partly along the periphery. For example, each indent 71 may be formed in two parts along the side surfaces depicted in FIG. 2 at the top and the bottom of the figure.

As Example VIII, electrostrictive elements were manufactured like the elements of Reference I except that indents were machined by a diamond cutter along the whole periphery after the first and the second external electrodes 33 and 34 (FIG. 19) were formed. Each indent 71 was 0.1 mm wide in the direction parallel to the stack axis and 0.1 mm deep perpendicularly of the axis. The center to center distance between two adjacent indents 71 was 2.0 mm. Parts into which the external electrodes 33 and 34 were divided by each indent 71, were connected together by lead wires. Each internal electrode area was 84% of the cross-sectional area which the above-described second peripheral parts had in common.

Turning to FIGS. 20 and 21, measurements were carried out for the life and the maximum displacement of the electrostrictive elements of Example VIII and of Reference I as described in connection with FIG. 5. The life was quite unexpectedly improved as shown by an upper line 72 for the elements of Example VIII. The maximum displacement was 1.9 microns and was a little improved as compared with that attained by the elements of Reference I and depicted by the lower line 42 as in FIG. 5.

As shown in FIG. 21, the dependency of displacement on the applied voltage was tested as described in conjunction with FIG. 6 for the elements of Example VIII and of Reference I. The results for the elements of Example VIII are illustrated by an upper curve 74. Those for the Reference I are shown by the lower curve 44 as in FIG. 6.

FIG. 22 is an electrostrictive element according to a seventh embodiment of this invention, similar to that illustrated with reference to FIGS. 3 and 4. The first external electrode 33 comprises first insulating layer portions 76 on a first area 46 (FIG. 8) to cover the respective peripheral ends of the above-mentioned others of the internal electrodes 32, leaving first area portions uncovered on the first area 46 between the insulating layer portions 76. The second external electrode 34 comprises second insulating layer portions 77 located on a second area 47 (FIG. 8) to cover the respective peripheral ends of the above-mentioned alternate ones of the internal electrodes 32 leaving second area portions on the second area 47 between the second insulating layer portions 77. The first external electrode 33 further comprises a first conductive layer 78 on the first insulating layer portions 76 and on the first area portions. The second external electrode 34 further comprises a second conductive layer 79 on the second insulating layer portions 77 and on the second area portions. It is possible with this to readily and stably form the first and the second external electrodes 33 and 34.

As Example IX, electrostrictive elements were manufactured like the elements of Example I. The internal structure was as described with reference to FIG. 22. The internal stack of green sheet pieces with prints was sintered at about 1250° C. for one hour. Epoxy resin was screen printed to provide the first and the second insulating layer portions 76 and 77. The first and the second conductive layers 78 and 79 were formed by evaporation. It was very readily feasible to form the first and the second external electrodes 33 and 34 in stable contact with the pertinent ones of the internal electrodes 32.

FIG. 23 is an electrostrictive element according to an eighth embodiment of this invention. First and second layer portions 81 and 82 of an opto-setting resinous material, such as a photoresist material, are substituted for the first and the second insulating layer portions 76 and 77, respectively. The resinous material is photosensitive. Some of such materials become insoluble in a solvent at portions irradiated with rays. Others of the materials become insoluble in a solvent at other portions.

As Example X, electrostrictive elements were manufactured like the elements of Example IX. After the sintering process, a resinous material which becomes insoluble at the portions exposed to ultravilot rays was applied onto the peripheral surface in two stripes along a first and a second area of each element. A mask was formed on each stripe. On the first area, the mask was formed to cover the stripe at portions at which the peripheral ends of alternate ones of the internal electrodes 32 (FIG. 23) were exposed on the peripheral surface. On the second area, the mask was formed to cover the stripe at portions at which the peripheral ends of other internal electrodes are exposed. Uncovered portions of the stripes were irradiated by ultraviolet rays. Those portions of the stripes which were under the masks and not irradiated by the ultraviolet rays, were removed together with the overlying masks by a solvent. The remaining portions of the stripes were cured at a temperature of about 900° C. to become the layer portions 81 and 82. A metal layer was evaporated towards each of the first and the second areas to provide the conductive layers 78 and 79. It was very easy to insure stable connection of the first and the second external electrodes 33 and 34 to the pertinent ones of the internal electrodes 32.

Turning further to FIG. 24, an electrostrictive element according to a ninth embodiment of this invention is similar in structure to those illustrated with reference to FIGS. 22 and 23. Instead of the insulating layer portions 76 and 77 or 81 and 82, first metal layer portions 83 are formed on the first area 46 in contact with the respective peripheral ends of alternate ones of the internal electrodes 32. On the second area 47, second metal layer portions 84 are formed in contact with the respective peripheral ends of other internal electrodes. As described in connection with FIGS. 3 and 4, first and second lead wires 86 and 87 are soldered or otherwise connected to the metal layer portions 83 and 84 on the first and the second areas 46 and 47, respectively. It is now understood that the first external electrode 33 comprises the first metal layer portions 83 and the first lead wire 86 and the second external electrode 34, the second metal layer portions 84 and the second lead wire 87. It is possible to raise the efficiency of production when the lead wires 86 and 87 are connected to the metal layer portions 83 and 84 either by thermocompression bonding or ultrasonic bonding, both known in the art of manufacturing IC's.

As Example XI, electrostrictive elements were manufactured like the elements of Example IX. After the sintering process, the first and the second metal layer portions 83 and 84 (FIG. 24) were formed by firing silver paste. Evaporation of aluminium or gold was equally well effective in manufacturing the metal layer portions 83 and 84.

Referring back to FIGS. 3 and 4, an electrostrictive element according to a tenth embodiment of this invention is similar in structure to that illustrated. Each internal electrode 32 is, however, made of an electroconductive material which consists essentially of a metal, such as platinum or palladium, and up to 60% by weight of the electrostrictive material of which the electrostrictive sections 31 are made.

It was already known in the art of manufacturing stacked chip capacitors that electrodes made of a metal do not tenaciously adhere to ceramic pieces among which the electrodes are interposed and that the strength of adhesion between each ceramic piece and the electrodes is improved when powder of the ceramic material is included in the electrodes so as to make the electrodes have nearly the same coefficient of thermal expansion as the ceramic piece. Although similar in structure, it has not yet been confirmed as regards multilayer electrostrictive elements whether or not inclusion of an electrostrictive material in the internal electrodes would improve the strength of adhesion between the electrostrictive sections and the internal electrodes because each multilayer electrostrictive element used either in a printer head or in a relay, is subjected to an appreciably great amount of elongation a great number of times in the direction of stack of the electrostrictive sections and the internal electrodes. As will presently become clear, it has now been confirmed that an electrostrictive element of the type being illustrated is excellent as regards the strength of adhesion.

As Example XII, electrostrictive elements were manufactured as described in connection with the elements of Example I. The platinum paste was, however, applied onto the green sheet pieces with the presintered powder added thereto in various proportions. The mixture of the platinum paste and the presintered powder was successfully sintered into the material of the internal electrodes during the sintering process.

Figure 25:
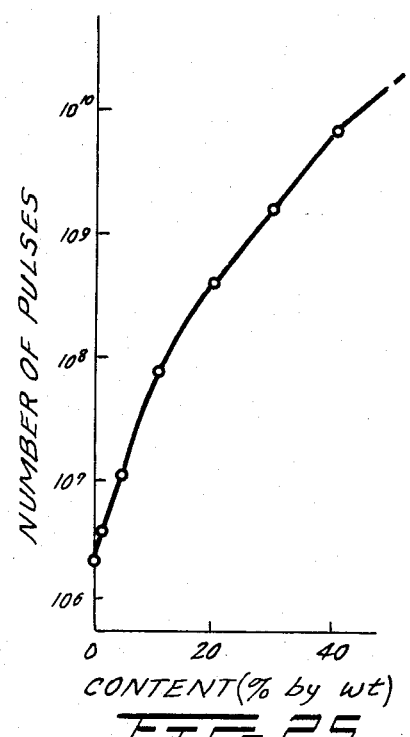
FIG. 25 shows the life for electrostrictive elements according to a tenth embodiment of this invention.

Referring to FIG. 25, the life was tested by the use of a pulse sequence which is similar to the sequence described in conjunction with FIG. 5 except that the amplitude of the sinusoidal wave was 400 volts rather than 250 volts. The curve shows the relationship between the life and the percentage by weight of the electrostrictive material. As in FIG. 5, the life was measured by the number of pulses which gave rise to cracks or other mechanical damage in the electrostrictive elements.

Figure 26:
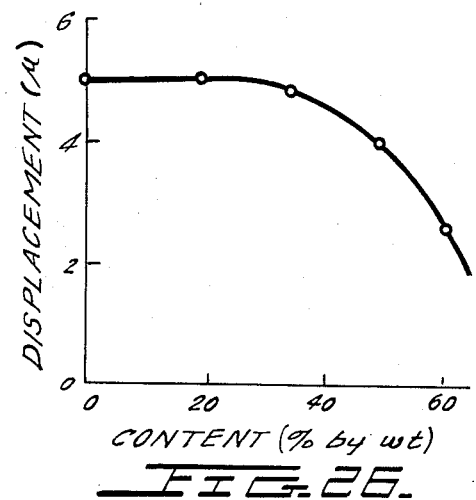
FIG. 26 shows the displacement attained by the elements mentioned in connection with FIG. 25.

Turning to FIG. 26, the maximum displacement was measured for the elements of Example XII. The curve shows the relationship between the maximum displacement and the percentage by weight of the electrostrictive material.

As seen from FIGS. 25 and 26, an increase in the content of the electrostrictive material is effective in lengthening life. Despite the relatively high voltage of 400 volts, the life exceeded one hundred million pulses when the content was in excess of 20% by weight. The content beyond 30% by weight, however, tended to decrease the maximum displacement. When the content was 60% by weight, the maximum displacement decreased to about a half. It is believed that this results from a decrease in an effective area of each internal electrode. Summarizing, the content should be 60% by weight or less and should most preferably be selected between 20% and 30%. It is to be noted that a zero content of the electrostrictive material corresponds to the electrostrictive element of the type illustrated with reference to FIGS. 3 and 4.

Returning to FIGS. 3 and 4, an electrostrictive element according to an eleventh embodiment of this invention has the same structure. Each internal electrode 32 is, however, made of an electroconductive material which consists essentially of a metal, such as platinum or palladium, and an additional electrostrictive material which can be sintered at a temperature lower than the electrostrictive material of the electrostrictive sections 31. It is believed that the additional electrostrictive material is better than the material of the electrostrictive sections 31 because the additional electrostrictive material is at least partly turned into liquid phase during the sintering process.

As Example XIII, electrostrictive elements were manufactured as described in conjunction with the elements of Example I, except for the following. Green sheet pieces were manufactured by the use of the first presintered power consisting essentially of lead magnesium niobate and lead titanate in a mol ratio of 65 to 35. The presintering was carried out at 850° C. for two hours. Second presintered powder was prepared, which consisted essentially of lead magnesium niobate and lead titanate in a mol ratio of 9 to 1 as described in connection with Examples I through XII. An electroconductive material was prepared by adding the second presintered powder to platinum paste in various proportions. Sintering of stacks of the predetermined dimensions was carried out at 1280° C. for one hour.

As Reference II, electrostrictive elements were manufactured like the elements of Example XII. The first presintered powder was used only for the electrostrictive sections. Sintering was carried out at 1280° C. for one hour as in Example XIII. It is to be noted that the elements of Reference II as herein called, are electrostrictive elements according to an aspect of this invention and are not conventional electrostrictive elements.

Figure 27:
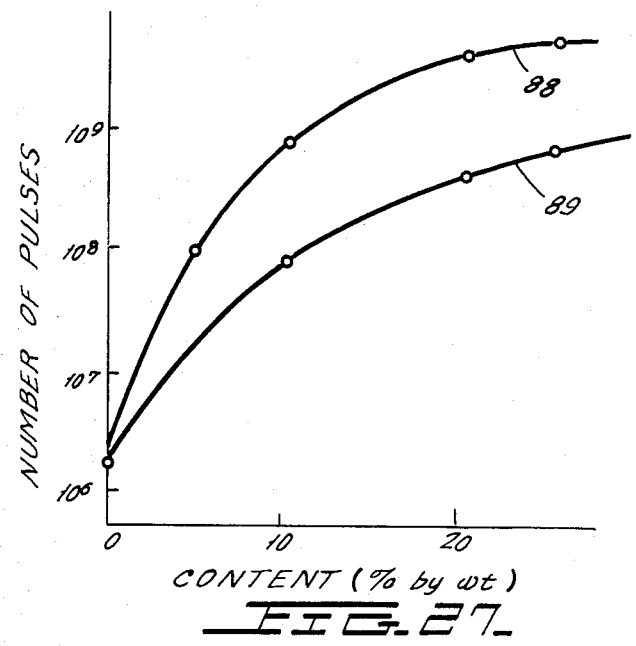
FIG. 27 shows the life for electrostrictive elements according to an eleventh embodiment of this invention and for the elements mentioned in connection with FIGS. 25 and 26.

In FIG. 27, the life was tested as described with reference to FIG. 25. An upper curve 88 shows the life of the elements of Example XIII for various contents of an electrostrictive material into which the second presintered powder was sintered in the internal electrodes. A lower curve 89 likewise shows the life for the elements of Reference II. It was confirmed that the content of an electrostrictive material of a lower sintering temperature should preferably be selected between 0 and 40% by weight, because a higher content tended to reduce the maximum displacement. It was furthermore found that the particle size of the presintered powder should preferably be up to 1 or 2 microns.

Referring to FIGS. 3 and 4 once again, an electrostrictive element according to a twelfth embodiment of this invention is similar in structure. Instead of a single metal or an alloy, each internal electrode 32 is made of an electroconductive material which consists essentially of platinum or palladium and up to 10% by weight of glass.

As Example XIV, electrostrictive elements were manufactured like those of Example XII. Zero to 20% by weight of soda glass was used instead of the presintered powder on coating the green sheet pieces.

Figure 28:
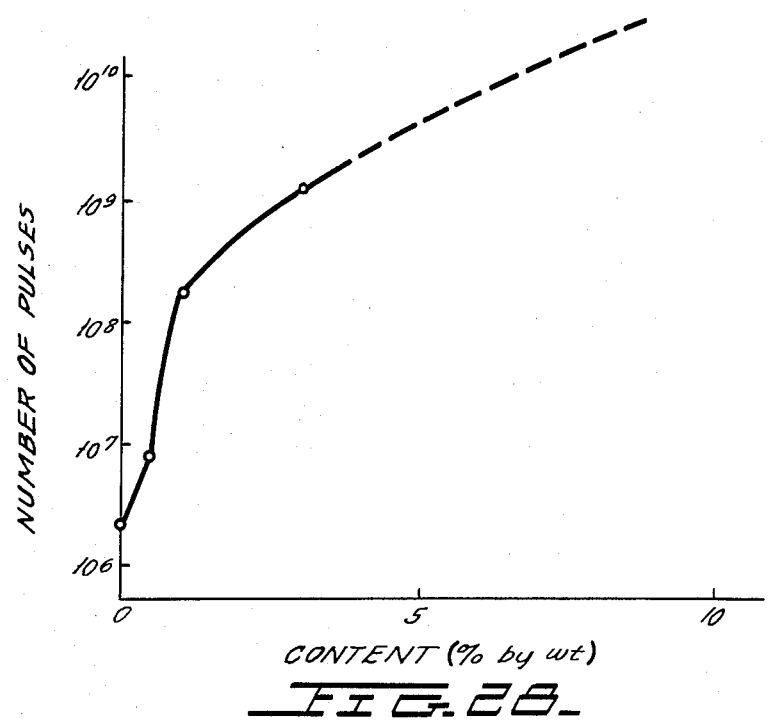
FIG. 28 shows the life for electrostrictive elements according to a twelfth embodiment of this invention.

Turning to FIG. 28, the life was tested as described in conjunction with FIG. 25 for the elements of Example XIV. When the internal electrodes did not include glass like the elements of Example I, the life for the pulses of the amplitude of 400 volts was of the order of two million pulses. It is clear that the life was astonishingly lengthened when the content of glass was 2% by weight or more.

Figure 29:
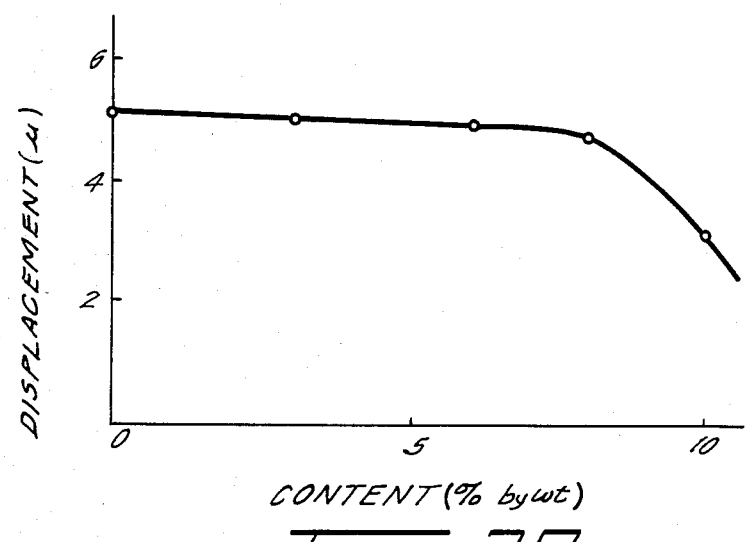
FIG. 29 shows the displacement achieved by the elements mentioned in conjunction with FIG. 28.

Finally referring to FIG. 29, the maximum displacement was measured as described in connection with FIG. 26. When the content of glass was 8% by weight, the maximum displacement showed a tendency of gradual decrease. When the content was 10% by weight, the maximum displacement decearesed to about a half.

While this invention has thus far been described with reference to the accompanying drawing, it will now readily be possible for one skilled in the art to carry this invention into effect in various other manners. For instance, the external electrodes 33 and 34 or the conductor rods 64 and 65 may not necessarily be parallel to the stack axis but may have a helical or the like form. Addition of the electrostrictive material or glass to the internal electrodes 32 is equally well applicable with excellent results to the electrostrictive elements illustrated with reference to FIGS. 7 and 9 and others. Use of the insulating layer portions 76 and 77 or 81 and 82 or of the metal layer portions 83 and 84, is preferable for easy and stable connection of the external electrodes 33 and 34 with the internal electrodes 32 also when the peripheral ends of the respective internal electrodes 32 are entirely situated on the peripheral surface of the stack, as described in conjunction with FIG. 11 or FIGS. 16 and 17.

What is claimed is:

1. A multilayer electrostrictive element for dimensionally changing in a first direction in response to electrical pulses and for withstanding repeated application of said pulses, said element comprising:

a stack formed by a plurality of electrostrictive sections of an electrostrictive material and a plurality of internal electrodes sandwiched between said electrostrictive sections, said stack having a peripheral surface defining a cross-sectional area of said stack, each of said internal electrodes having peripheral ends on said peripheral surface and each of said internal electrodes having an internal electrode area which is substantially equal to a cross-sectional area of said stack;

first means for electrically connecting alternate ones of said internal electrodes together without connecting others of said internal electrodes, said first means including first insulating layer portions on a first area of said peripheral surface for covering respective peripheral ends of said others of said internal electrodes while leaving portions of said first area uncovered, each said first insulating layer portion covering the peripheral end of a respective internal electrode while extending in said first direction substantially less than the entire distance between said respective first electrode and either adjacent first electrode to leave uncovered substantial portions of the surfaces of said electrostrictive sections in said first area of said peripheral surface, and a first conductive layer continuously formed on both said first insulating layer portions and on said uncovered portions of said first area; and second means for electrically connecting said others of said internal electrodes together, said second means including second insulating layer portions on a second area of said peripheral surface for covering respective peripheral ends of said alternate ones of said internal electrodes while leaving portions of said second area uncovered, and a second conductive layer continuously formed on both said second insulating layer portions and on said uncovered portions of said second area.

2. An electrostrictive element as claimed in claim 1, wherein each internal electrode is made of an electroconductive material consisting essentially of a metal and an additional electrostrictive material of a sintering temperature which is lower than a temperature of sintering the electrostrictive material of said electrostrictive sections.

3. An electrostrictive element as claimed in claim 2, wherein said electroconductive material includes up to 40% by weight of said additional electrostrictive material.

4. An electrostrictive element as claimed in claim 1, wherein said first and second insulating layer portions comprise a photosensitive resin.

* * * * *

UNITED STATES PATENT AND TRADEMARK OFFICE
CERTIFICATE OF CORRECTION

PATENT NO. : 4,523,121

DATED : June 11, 1985

INVENTOR(S) : Sadayuki Takahashi et al, Tokyo Japan

It is certified that error appears in the above-identified patent and that said Letters Patent is hereby corrected as shown below:

Column 1, line 10, change "electrostrtictive" to --electrostrictive--;

line 22, after "life" insert --even--;

line 27, delete "an electrostrictive piece of a" and insert --a piece of electrostrictive--;

line 31, change "electic" to --electric--.

Column 2, line 55, change "togther" to --together--;

Column 3, line 9, change "electronstrictive" to --electrostrictive--.

Column 4, line 24-25, after "invention" delete ", although the claims are directed primarily to FIG. 22.".

Column 8, line 16, change "respectivly" to --respectively--;

line 51, delete "outer" and insert --other--.

Column 15, line 31, change "decearesed" to --decreased--.

UNITED STATES PATENT AND TRADEMARK OFFICE
CERTIFICATE OF CORRECTION

PATENT NO. : 4,523,121

DATED : June 11, 1985

INVENTOR(S) : Sadayuki Takahashi et al.

It is certified that error appears in the above-identified patent and that said Letters Patent is hereby corrected as shown below:

Column 15, line 31, change "decearesed" to -- decreased --.

Signed and Sealed this

Twenty-ninth Day of April 1986

[SEAL]

Attest:

DONALD J. QUIGG

Attesting Officer

Commissioner of Patents and Trademarks